US009449824B2

(12) United States Patent
Levy et al.

(10) Patent No.: US 9,449,824 B2
(45) Date of Patent: Sep. 20, 2016

(54) METHOD FOR PATTERNED DOPING OF A SEMICONDUCTOR

(71) Applicants: David H. Levy, Rochester, NY (US); Daniele Margadonna, Ciampino (IT); Dennis Flood, Oberlin, OH (US); Wendy G. Ahearn, Rochester, NY (US); Richard W. Topel, Jr., Rochester, NY (US); Theodore Zubil, Honeoye Falls, NY (US)

(72) Inventors: David H. Levy, Rochester, NY (US); Daniele Margadonna, Ciampino (IT); Dennis Flood, Oberlin, OH (US); Wendy G. Ahearn, Rochester, NY (US); Richard W. Topel, Jr., Rochester, NY (US); Theodore Zubil, Honeoye Falls, NY (US)

(73) Assignee: Natcore Technology, Inc., Rochester, NY (US)

( * ) Notice: Subject to any disclaimer, the term of this patent is extended or adjusted under 35 U.S.C. 154(b) by 131 days.

(21) Appl. No.: 14/260,514

(22) Filed: Apr. 24, 2014

(65) Prior Publication Data
US 2014/0322906 A1 Oct. 30, 2014

Related U.S. Application Data

(60) Provisional application No. 61/815,524, filed on Apr. 24, 2013.

(51) Int. Cl.
H01L 21/22 (2006.01)
H01L 21/38 (2006.01)
H01L 21/223 (2006.01)
H01L 31/068 (2012.01)
H01L 31/18 (2006.01)

(52) U.S. Cl.
CPC ........... H01L 21/223 (2013.01); H01L 31/068 (2013.01); H01L 31/1804 (2013.01); Y02E 10/547 (2013.01); Y02P 70/521 (2015.11)

(58) Field of Classification Search
CPC ............... H01L 21/02164; H01L 21/02282; H01L 21/02488; H01L 21/223; H01L 21/266; H01L 21/28211; H01L 21/288; H01L 21/316; H01L 21/31612; H01L 27/1292
USPC ....... 438/232, 394, 418, 491, 495, 499, 501, 438/542, 549, 565, 599, 914, 920, 923, 438/FOR. 241, FOR. 274, FOR. 276, 438/FOR. 301
See application file for complete search history.

(56) References Cited

U.S. PATENT DOCUMENTS

| 3,652,273 | A | 3/1972 | Htoo |
| 4,485,125 | A | 11/1984 | Izu et al. |
| 4,521,441 | A | 6/1985 | Flowers |
| 5,256,593 | A | 10/1993 | Iwai |
| 5,470,681 | A | 11/1995 | Brunner et al. |
| 5,525,535 | A | 6/1996 | Hong et al. |
| 5,920,774 | A | 7/1999 | Wu |
| 6,207,538 | B1 * | 3/2001 | Pan ................ H01L 21/823892 257/E21.644 |
| 8,288,193 | B2 | 10/2012 | Wu et al. |
| 8,293,568 | B2 | 10/2012 | Rubin et al. |
| 2005/0181566 | A1 | 8/2005 | Machida et al. |
| 2011/0193195 | A1 | 8/2011 | Atwater et al. |
| 2011/0214727 | A1 | 9/2011 | Esturo-Breton et al. |

* cited by examiner

Primary Examiner — John P Dulka
Assistant Examiner — Joannie A Garcia
(74) Attorney, Agent, or Firm — Winstead PC

(57) ABSTRACT

A method for an improved doping process allows for improved control of doping concentrations on a substrate. The method may comprise printing a polymeric material on a substrate in a desired pattern; and depositing a barrier layer on the substrate with a liquid phase deposition process, wherein a pattern of the barrier layer is defined by the polymeric material. The method further comprises removing the polymeric material, and doping the substrate. The barrier layer substantially prevents or reduces doping of the substrate to allow patterned doping regions to be formed on the substrate. The method can be repeated to allow additional doping regions to be formed on the substrate.

19 Claims, 4 Drawing Sheets

METHOD FOR PATTERNED DOPING OF A SEMICONDUCTOR

RELATED APPLICATIONS

This application claims the benefit of U.S. Provisional Patent Application No. 61/815,524, filed on Apr. 24, 2013, which is incorporated herein by reference.

FIELD OF THE INVENTION

This invention relates to methods and systems for patterned doping of a substrate. More particularly, to pattern doping of a substrate for solar cells.

BACKGROUND OF INVENTION

A crystalline silicon photovoltaic (PV) cell typically has a first surface operable to receive light and a second surface opposite the first surface. The first surface is doped to form the emitter of the PV cell and has a plurality of electrical contacts formed therein. The second surface has at least one electrical contact.

The first contacts are typically formed as a plurality of parallel spaced apart "fingers" that extend across the entire first surface. The fingers are formed by screen printing a metallic paste onto the first surface in a desired pattern. The metallic paste is fired by high temperature treatment to form a conductive metal pattern that also forms electrical contact to the emitter. Additional paste may be provided to create bus bars that extend at right angles to the fingers, to collect electric current from the fingers. The bus bars may be wider than the fingers to enable them to carry the current collected from the fingers.

Screen printing and firing technology imposes limitations on solar cell efficiency improvements due to a restriction on emitter thickness. When the emitter thickness is not sufficient, diffusion of the contact metal during firing may exceed the emitter depth leading to electrical shunting through the pn junction. Furthermore, a thin emitter usually implies a lower level of doping which can lead to poor electrical contact between the emitter and the metal contact. Some screen printing technology requires an emitter thickness of greater than 0.2 micrometers, corresponding to a sheet resistance below 65 ohm/sq. However, an emitter with a sheet resistance of greater than about 100 ohm/sq and thickness of less than about 0.2 micrometers provides a substantial gain in cell efficiency mainly due to lower optical losses in the blue spectral region. An emitter with these properties is referred to as a shallow emitter. In order to increase the conversion efficiency of solar cells that employ the abovementioned screen printed metallization, emitter design parameters may be optimized such that under a screen printed finger, an emitter thickness is sufficiently, high while in light-illuminated areas, the emitter thickness is substantially thinner. An emitter with these differing thicknesses is referred to as a selective emitter. In a selective emitter, sufficient emitter thickness and high dopant concentration in areas under current collecting fingers and bus bars ensures low resistance electrical contacts between the semiconductor substrate and the fingers and bus bars without shunting the p/n junction. Although the use of a selective emitter has proved to be effective in improving PV cell efficiency, implementation of a selective emitter in practice, is quite complicated.

The emitter in PV cells may be produced by a dopant diffusion process. In such a process, the wafer is heated in the presence of a desired dopant or its precursor, allowing a controlled quantity of the dopant to diffuse a certain depth into the wafer (referred to as the dopant diffusion or the emitter diffusion).

Selective emitters have been attempted by a number of strategies. An etchback process as described in U.S. Pat. No. 8,293,568 involves producing a uniform deep emitter across the substrate, and etching back selected areas to make those areas shallow. In contrast, there are methods that start with a shallow emitter and produce regions that are deeper either by the use of laser treatment additional chemical treatments, as described in US 2011/0214727. A very promising route to the selective emitter cell involves the application of patterned barrier layers prior to doping, such that doping will be high where there is little or no barrier, and doping will be lower where there is a more substantial barrier.

One barrier approach uses silicon dioxide deposited by thermal oxidation at elevated temperature (800 to 1100 C) followed by patterning of the oxide using laser ablation or etching as described in U.S. Patent Appl. Pub. 2011/0214727. However, this process requires that the substrate be subjected to an expensive high temperature oxidation. This additional high temperature heating may cause defects that may be detrimental to charge carrier lifetime and cell performance. One method to apply silicon nitride as the barrier involves treatment of the wafer in a nitrogen plasma as described in U.S. Pat. No. 8,288,193. However, this process requires a vacuum plasma treatment of the substrate. Another method to form silicon oxide as the barrier involves electrochemical formation as described in U.S. Pat. No. 8,293,568. However, electrochemical treatments involve a high degree of equipment complexity to permit electrical contact to substrates.

We have found that the liquid phase deposition (LPD) of silicon dioxide forms an excellent barrier to diffusion of phosphorous at high temperature. The LPD process is advantageous because it can be performed at low temperature in a liquid bath without the need for any addition physical forces (such as electric current). We have further found that the LPD films provide excellent function as barrier layers to dopant diffusion when they are patterned by prior application of certain polymer resists.

SUMMARY OF THE INVENTION

In one embodiment, a method of producing patterned doping on a semiconductor comprises selecting a semiconductor substrate; printing of a polymeric material on the substrate, wherein said polymeric material prevents the deposition of a liquid phase deposition (LPD) material; and depositing the LPD material on the substrate. The polymeric material prevents the deposition of LPD on the substrate where it was printed. The method also includes removing the polymeric material from the semiconductor substrate, and diffusing a dopant into the substrate. The diffusion of said dopant into said semiconductor substrate is impeded by said LPD material, which allows the substrate to form first doping region(s) where the LPD material was not present. Additionally, second region(s) below the LPD material may form either a region substantially unchanged by the doping or a region that is doped to a lesser degree than the first doping region(s). In another embodiment, when the second region(s) is substantially unchanged by doping, the method may be repeated to form another doping region in the second regions(s).

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 4A-4G are illustrative embodiments of a substrate produced with patterned discrete surface doping regions.

DETAILED DESCRIPTION

Figure 1:
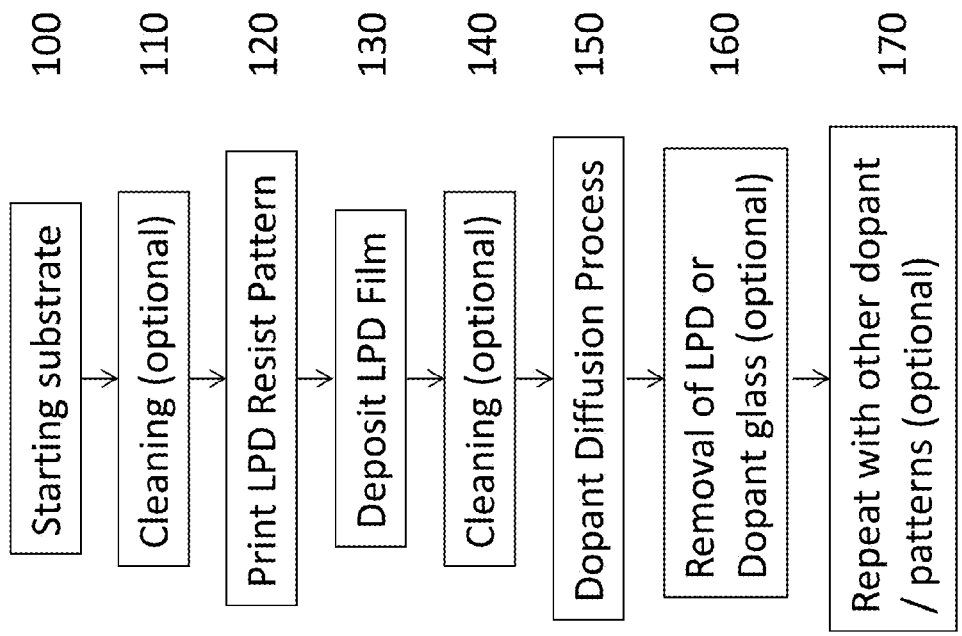
FIG. 1 is an illustrative embodiment of is an illustrative embodiment of a flow diagram of a method for producing a semiconductor substrate with at least one patterned surface doping region.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Methods for producing a semiconductor substrate with at least one patterned surface doping region are discussed herein. A surface doping region is defined as a region of the semiconductor surface that includes a variation in doping relative to the bulk of the semiconductor substrate. In some embodiments, the surface doping region may be less than or equal to 10 microns thick. In other embodiments, the surface doping region may be less than or equal to 5 microns thick. In other embodiments, the surface doping region may be less than or equal to 2 microns thick. The variation in doping may include a different concentration of the same dopant or dopants as in the bulk, or may include one or more different doping species than those found in substantial quantities in the bulk.

The method may be used for any semiconductor device to provide patterned surface doping regions. In a nonlimiting embodiment, the method is utilized for the fabrication of solar cells. This method is particularly well suited to the fabrication of solar cells that require patterned doping, such as selective emitter solar cell, and cells requiring localized doping such as Passivated Emitter Rear Localized (PERL) cells or all back contact cells, also known as a back contact/back junction (BC-BJ) cells.

FIG. 1 is an illustrative embodiment of a flow diagram of a method for producing a semiconductor substrate with at least one patterned surface doping region. A suitable substrate (step 100) is introduced into the process. The suitable substrate may be a semiconductor wafer of any convenient size or shape. Nonlimiting examples of suitable semiconductors includes group IV semiconductors such as silicon or germanium, group III-V semiconductors such as gallium arsenide or indium phosphide, and group II-VI semiconductors such as cadmium telluride. In some embodiments, the substrate thickness is equal to or below about 1 mm. The surface of the semiconductor wafer may be polished. In some embodiments for solar cell applications, the starting wafer may have a surface that is textured to promote light absorption. The surface texture may be applied by mechanical means, laser processes, chemical etching processes, or the like. In some embodiments for silicon wafers, the surface texture may contain exposure of predominantly <111> and <110> facets, such as is obtained by treatment with basic solutions containing KOH or NaOH in conjunction with surfactants such as alcohols.

The starting substrate may be highly pure and thus nearly intrinsic in doping character or may have a particular bulk doping leading it to be n-type or p-type. The presence of doping modifies the bulk resistivity of the substrate. In some embodiments, substrates have a bulk resistivity of equal to or between about 0.1 to 50 ohm-cm. In some embodiments, substrates have a bulk resistivity equal to or between about 1 to 5 ohm-cm. In some embodiments, the substrate may have patterned doping regions. In some embodiments, the substrate may have various films on its surface such as dielectric or metal films. From the foregoing description, it is clear that the method is applicable to various substrates. Further, it will be recognized, that a suitable substrate is in no way limited to the particular embodiments discussed.

The substrate is optionally cleaned (step 110). Cleaning of the substrate may be done by solution means, including, but not limited to, treatments with acids, bases, and oxidizing chemistries. Suitable cleaning solutions include the so called RCA process, involving exposure to at least (1) a solution including HCl and $H_2O_2$; (2) a solution including $NH_4OH$ and $H_2O_2$; and (3) a solution including HF. The exposure to cleaning solutions can include exposure to any combination of them in any suitable order. Cleaning can also include other solution exposures, such as the Piranha etch, comprising $H_2SO_4$ and $H_2O_2$, or solvent exposures, or cleaning in water. Useful solvents include alcohols, ketones, hydrocarbons, or halogenated solvents. Cleaning can also involve dry processes. These include ozone exposures, corona discharge treatments, plasma treatments, or the like. The treatments may be intended to clean the surface; however, it may be useful to combine cleaning with treatments that etch the surface.

The resist pattern is next applied to the substrate (step 120). The resist may be a polymeric material that can be formulated for easy printing, prevents the deposition of LPD films on its surface, and can be easily removed. The ease of removal requires that the polymer not degrade, crosslink, or harden during exposure to the chemistries of subsequent process steps. The polymer should not be soluble in water since it may need to survive water based processing steps, but for ease of processing and cleaning in manufacture it may be soluble in solvents that are themselves soluble in water. For example, polymers that work well for this method may require solubility in polar solvents (such as alcohols and alkyl acetates), but insolubility in water. Thus, they can be applied by conventional printing methods, but do not dissolve during water based processing steps (such as the LPD deposition itself).

The resist material must completely or partially prevent the deposition of LPD in the regions in which it is present. If the resist does not minimize the deposition of a LPD film, then the LPD film could form a barrier that prevents the resist from being easily removed. In the case of complete prevention of deposition, the process is a complete selective deposition. In the case of partial prevention of deposition, the process is partial selective deposition followed by liftoff where the portions of LPD film that forms on top of the resist are removed by dissolution of the resist. In some embodiments, complete selective deposition is desirable so that partial films of LPD that are lifted off do not contaminate the processing system.

Co-polymers comprised principally poly(vinylbutyral), poly(vinylacetate), and poly(vinylalcohol) may provide complete selective deposition and prevent the deposition of LPD films. In some embodiments, the polymers include equal to or greater than about 70% (molar basis) poly(vinylbutyral), equal to or between 5% and 25% polyvinyl alcohol, with the remainder of poly(vinylacetate). In some embodiments, the polymers include equal to or greater than about 80% (molar basis) poly(vinylbutyral), equal to or between about 10% and 20% polyvinyl alcohol, with the remainder of poly(vinylacetate).

The resist may be printed by any conventional means, including inkjet printing or contact printing methods, such as flexographic printing. In some embodiments, the polymer may be printed using screen printing, as it is compatible with current solar cell processing. Ink formulations require the polymer to be in a solvent that has the correct evaporating and viscosity properties to make a suitable ink for printing. Appropriate solvents for the above polymers may include alcohols, including methanol, ethanol, isopropanol, large molecular weight alcohols, or the like. Appropriate solvents may also include ketones, including branched or straight chain compounds such as acetone or methyl isobutyl ketone, cyclic compounds such as cyclohexane, or the like. In some embodiments, the solvents include compounds that contain an ether or a ketone functionality in addition to an alcohol functionality. Nonlimiting examples of such materials may include butoxyethanol and diacetonealcohol. In some embodiments, the resist formulation may include fillers, surfactant, coating aids or drying aids.

After application of the resist material, the sample is coated using the Liquid Phase Deposition (LPD) process (step 130). The LPD film forms a barrier or mask layer on the substrate that modulates dopant diffusion in subsequent process steps. The LPD process relies upon manipulation of the chemical equilibrium of a solution containing precursors of a desired inorganic material. In some embodiments, the LPD process provides for the deposition of oxides such as but not limited to silicon dioxide, aluminum oxide, and titanium dioxide. According to one embodiment, silicon dioxide is at least partially dissolved in the solution; and more preferably the solution further comprises $H_2SiF_6$ (fluorosilicic acid). Without wishing to be bound by any particular theory, it is believed that fluorosilicic acid can react with base to produce silicon dioxide, as shown in Equation (1).

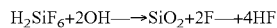  (1)

The silicon dioxide LPD process requires as one reagent a saturated solution of silicon dioxide in $H_2SiF_6$. This solution is produced by combining a solution of equal to or between about 15 to 40% $H_2SiF_6$ by weight with an excess of silica in the form of a powder or concentrated slurry. The silica is dissolved to saturation at which point any excess silicon if filtered out. In some embodiments, the above saturated solution is combined with water in a ratio of equal to or between 1 part saturated solution to equal to or between about 0.5 and 10 parts waters. In some embodiments, the above solution is combined with water in a ratio of equal to or between 1 part saturated solution to equal to or between about 1.5 and 3 parts water. This mixture is maintained at a temperature equal to or between about 10° C. and 70° C., preferably equal to or between about 25° C. and 60° C. The substrates requiring deposition are placed within the mixture for times ranging from several minutes to several hours. Silicon dioxide grows spontaneously upon the immersed substrates, and the total growth can be controlled by modulating concentration, temperature, deposition time, or a combination thereof. Layer thickness for the LPD films will be discussed subsequently.

After LPD deposition, the substrate contains an LPD film with a pattern defined by the prior applied polymer resist (step 120). The resist still present upon the substrate may optionally be removed prior to further processing (step 140). Removal can occur by rinsing, spraying, or immersion in an appropriate solvent. In some embodiments, the solvent is capable of solubilizing the resist material and is soluble in water to enable compatibility with subsequent processing steps and cleanup. Nonlimiting examples of solvents are alcohols, such as methanol, ethanol, isopropanol or the like. Smaller ketones, such as acetone, may also be utilized. In some embodiments, the removal of the resist may involve mechanical assistance such as sonication, sparging, mixing, or the like. Alternatively, the resist can be removed by dry processes, such as ozone treatment or plasma treatment. Suitable plasmas include an oxygen plasma in vacuum or in the form of an atmospheric air or oxygen plasma jet. In some embodiments, the resist may be removed by a burn off process that subjects the substrate to temperatures of 500° C. or greater. The burn off process may occur in the presence of oxygen and may occur for 1 minute or greater. This burn off process may be performed prior to, during ramp up to, or during a doping process. In a preferred embodiment, the burn off is performed as part of the ramp up to diffusion. This may, but does not necessarily require, loading at a lower temperature than is normally done (e.g. normal may be 700° C., whereas loading at a lower temperature may occur at temperatures equal to or between 400 to 600° C.). Additionally, during the loading or initial temperature ramp prior to doping, it may be desirable to expose the substrate to oxygen (e.g. 1 molar % or greater) to ensure full combustion of the resist. In some embodiments, it may also be useful to have a combination of processes, including, but not limited to, the processes discussed above. For example, a wet process using an appropriate solvent may remove a substantial amount of the resist, and a dry process that removes remaining residue. Nonlimiting examples of the dry process may include a de-scum, dry etch, and/or burn off process to remove the resist and/or remaining residue.

The substrate is subjected to a dopant diffusion process (step 150). The dopant diffusion process involves elevating the temperature of the wafer and exposing it dopant precursor gases within an overall gas composition for a predetermined time. For production of an n-type doping region, a dopant atom may be phosphorous, which can be supplied by exposing the wafer to any suitable material containing phosphorous. This includes exposure to easily vaporizable phosphorous sources such as phosphine ($PH_3$) or phosphorous oxychloride ($POCl_3$). In some embodiments, the step may also involve applying a coating to the wafer prior to the high temperature step which contains phosphorous. Nonlimiting examples of coatings include so called spin on dopants, preferably dopants which contain $P_2O_5$ glasses in mixtures with silica and alumina based glasses. For production of a p-type doping region, a dopant atom may be boron, which can be supplied by exposing the wafer to any suitable material containing boron. This includes exposure to easily vaporizable boron sources such as boron tribromide ($BBr_3$). In some embodiments, the step may also involve applying a coating to the wafer prior to the high temperature step which contains boron. Nonlimiting examples of coatings include so called spin on dopants, preferably ones which contain borosilicate glasses in mixtures with silica and alumina based glasses.

A vaporized dopant diffusion includes the following steps: (a) an initial temperature ramp to raise the temperature of the wafer to diffusion temperatures; (b) a dopant vapor flow, in which the gas mixture flowing over the substrates includes the dopant source or dopant precursor, and optionally an oxygen and nitrogen gas background; (c) a drive-in comprising a further exposure to a background gas mixture of oxygen and nitrogen gas mixture, but without the presence of the dopant precursors; and (d) a step to cool down the wafer.

It has been found that certain diffusion conditions work best with the LPD produced barrier. In some embodiments, it is desirable to tune the thickness of the LPD layer to get the highest difference in substrate doping between areas that have the barrier and those that do not. While a thicker LPD layer can be utilized, it is preferable only utilize a thickness necessary to achieve to achieve the desired doping levels. Further, this allows the process to remain fast and relatively inexpensive. The parameters that can be measured is the total amount of dopant (in areas containing the barrier layer versus those areas that do not), or more easily the sheet resistance of the respective areas.

It has been found that the inclusion of a step exposing the wafer to a concentration of 1% (molar) oxygen or greater for 2 minutes or greater improves the performance of the LPD film as a barrier layer. This exposure step is performed after the initial temperature ramp, but prior to the dopant vapor flow. Not wishing to be bound by theory, it is believed that the inclusion of such step either reduces any porosity that exists in the as deposited LPD film, or provides appropriate chemical termination to and chemical moieties in the LPD films that were not previously reacted and converts them to stoichiometric $SiO_2$.

It has further been found that the time of dopant flow relative to the time of the drive in should be kept at a minimum to ensure the best operation of the LPD barrier layer. In some embodiments, the time of the dopant vapor flow can be equal to or between 2 minutes to 30 minutes, preferably equal to or between 10 minutes to 20 minutes. In some embodiments, the molar concentration of the dopant in the dopant vapor flow can be equal to or between 0.1 to 3%, preferably equal to or between 0.25 to 1%. In some embodiments, the ratio of the time of the dopant vapor flow to the time of the drive in is equal to or below 1:1, preferably equal to or below 1:1.5. Not wishing to be bound by theory, it is believed that longer dopant vapor flows convert the LPD $SiO_2$ to a phosphorous doped glass, which at the temperatures of the diffusion has poorer barrier properties.

Additionally, certain oxygen concentrations are desirable during the dopant vapor flow to ensure the best operation of the LPD barrier layer. In some embodiments, the molar oxygen concentration in the dopant vapor flow step can be equal to or between 0.5 to 3%, preferably equal to or between 0.7 to 2%.

After the doping process, layers present from prior process steps may be optionally removed (step 160). These layers may include the dopant glasses that are a byproduct of the diffusion process, including phosphosilicate glasses or borosilicate glasses. These layers may also include the LPD barrier layers that have been previously applied. The removal may be accomplished with any chemical bath that dissolves the desired layers. For example, a bath containing HF may be utilized to dissolve the layers.

Next, the substrate may optionally undergo additional processing steps to independently pattern additional doping regions (step 170). Alternatively, the substrate may go on to subsequent steps involved in standard solar cell construction such as, but not limited to, the application of the antireflection layer, the application of metal contacts, assembly into photovoltaic modules, or the like. For selective emitter applications, the application of the contacts may be aligned with the LPD pattern created by the combination of steps 120 and 130. This alignment can be achieved with mechanical means referencing from edges and/or corners of the wafer, optical means referencing from edges and/or corners of the wafer, or fiducial marks that are applied on or before step 120, or a combination thereof.

Figure 2C:
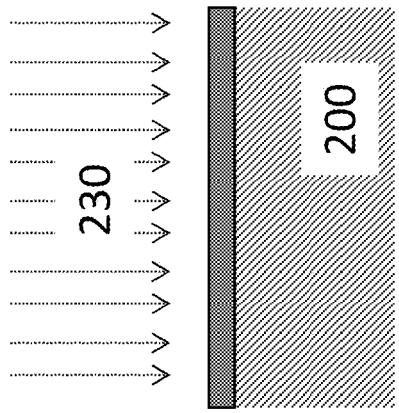
FIGS. 2A-2D are illustrative embodiments of a substrate that has a uniform barrier layer.
Figure 2B:
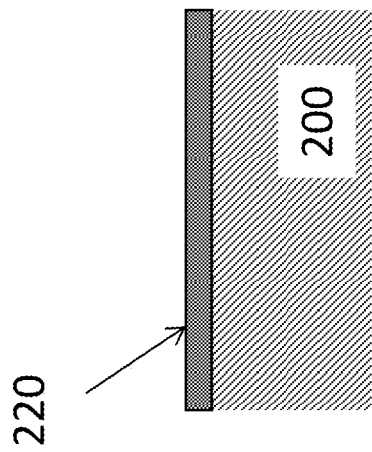
Figure 2A:
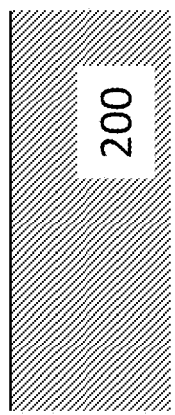
Figure 2D:
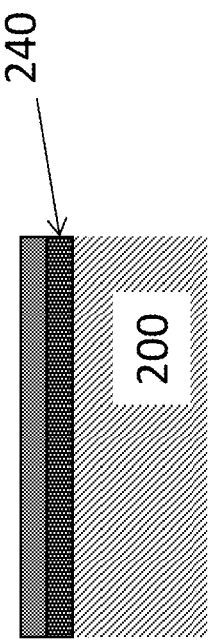

FIGS. 2A-2D are illustrative embodiments of a substrate that has a uniform barrier layer of LPD silica in order to modulate the level of doping. This is useful to modulate the profile of incorporated dopant relative to that with no LPD silica barrier layer. A bare substrate 200 in FIG. 2A receives a uniform barrier layer of LPD silica 220 (FIG. 2B). The substrate is then subjected to a doping process 230 (FIG. 2C) which leads to a surface doping layer 240 (FIG. 2D). The surface doping layer may be uniform across the substrate 200, but has modified profile that is less deep relative to a doping layer that would be produced without the LPD barrier layer 220.

Figure 3A:
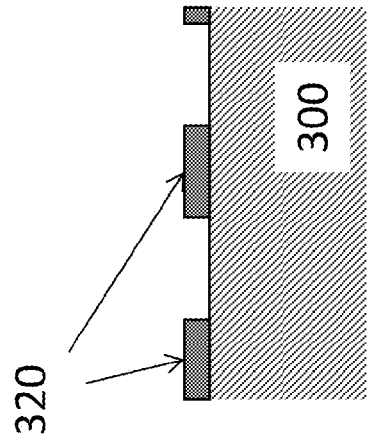
FIGS. 3A-3E are illustrative embodiments of a substrate produced with patterned surface doping regions.
Figure 3B:
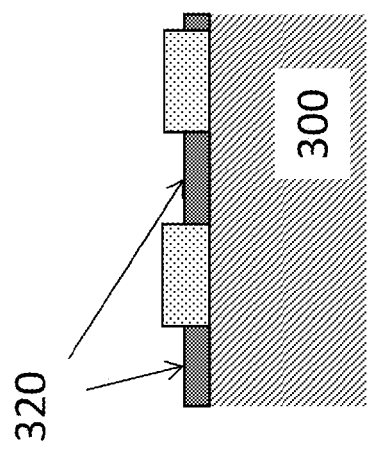
Figure 3C:
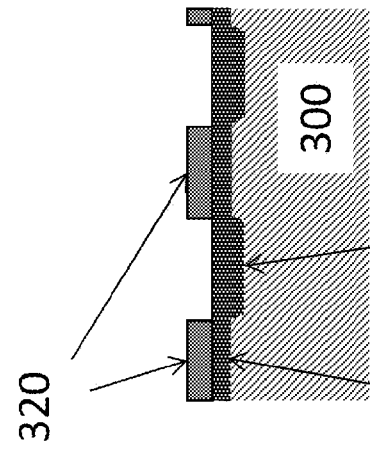
Figure 3D:
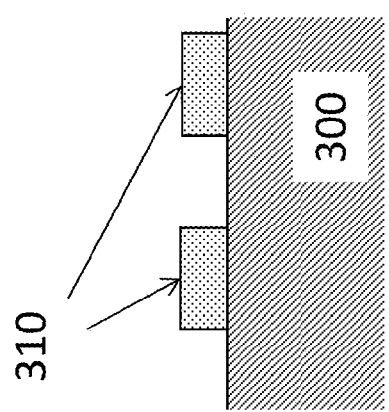
Figure 3E:
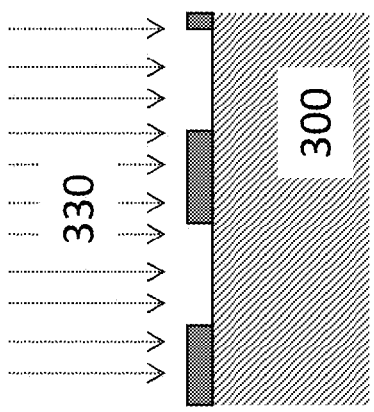

FIGS. 3A-3D are illustrative embodiments of a substrate produced with patterned surface doping regions. The doping regions have two different depths and represent a useful process in the fabrication of a selective emitter solar cell. A polymer resist pattern 310 is printed on to substrate 300 (FIG. 3A). The resulting substrate is immersed in an LPD deposition solution, resulting in a patterned LPD barrier layer 320 in the areas absent of the polymer resist 310 (FIG. 3B). The LPD layer may be thin enough that during the doping process diffusion of the dopant through the LPD barrier will be impeded, but will still occur and leading to some doping under the barrier. An LPD layer for this type of process may be equal to or less than about 100 nm thick. In other embodiments, the LPD layer may be equal to or less than 50 nm thick, preferably equal to or less than about 30 nm. The polymer resist 310 is removed by appropriate treatment with a solvent or dry process (FIG. 3C). The substrate is then subjected to a doping process 330 (FIG. 3D) which leads to a surface doping layer regions 345 and 350 (FIG. 3E). Region 345 which sits under the LPD barrier layer is less deep than region 350 which is associated with no barrier layer. As a result, region 345 would have a higher resistivity than region 350, as is desired for a selective emitter construction. For completion of a solar cell according to this embodiment, metal contacts need to be substantially aligned to the regions 350 containing the deeper doping. This can occur at any suitable point in the remaining process.

Figure 4A:
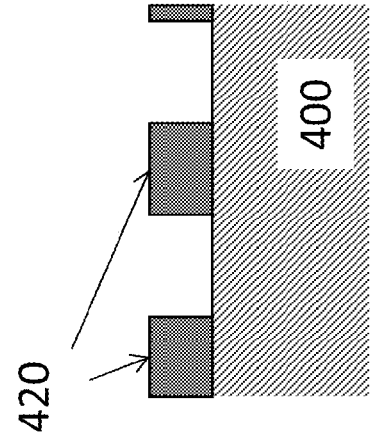
Figure 4B:
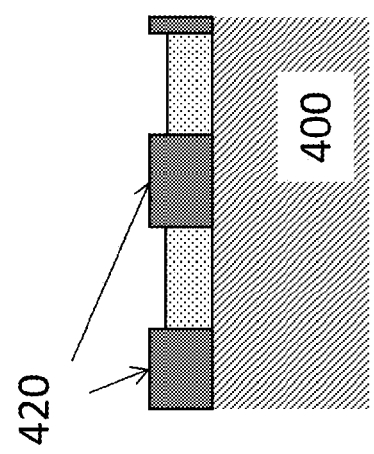
Figure 4C:
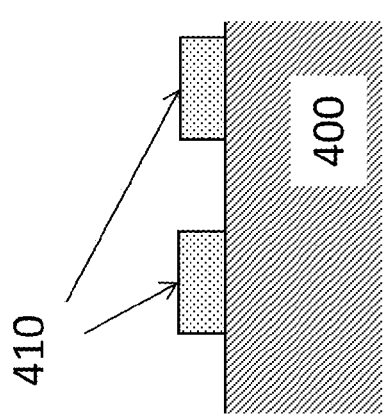
Figure 4D:
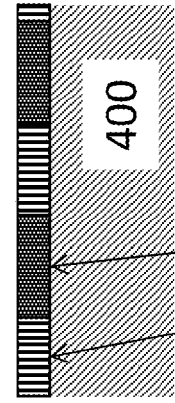
Figure 4F:
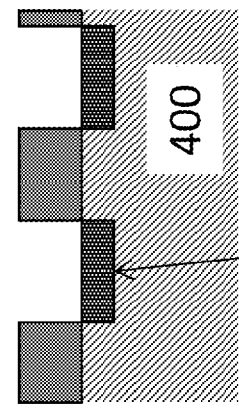
Figure 4G:
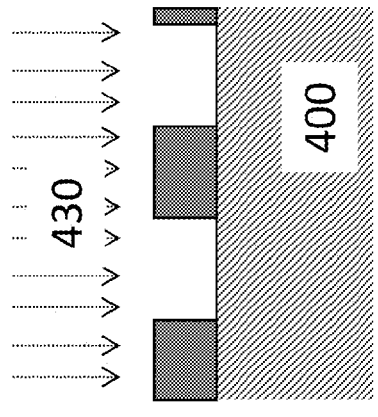

FIGS. 4A-4D are illustrative embodiments of a substrate produced with patterned discrete surface doping regions where regions outside of the intended doping regions are substantially unaffected during an individual doping process. A polymer resist pattern 410 is printed on to substrate 400 (FIG. 4A). The resulting substrate is immersed in an LPD deposition solution, resulting in a patterned LPD barrier layer 420 in the areas absent of the polymer resist 410 (FIG. 4B). The LPD layer is thick enough that during the doping process diffusion of the dopant through the LPD barrier is essentially eliminated, leading to substantially no doping under the LPD barrier layer. An LPD layer for this type of process may be greater than 40 nm thick. However, with variations in the doping process, thinner layers may be sufficient. The polymer resist 410 is removed by appropriate treatment with a solvent or dry process (FIG. 4C). The substrate is then subjected to a doping process 430 (FIG. 4D) which leads to surface doping layer regions 450 where the LPD barrier layer is not present. Such a doping structure would be useful for the localized heavily doping region in the back side of a PERL cell. The substrate could be additionally processed by the same sequence steps illustrated in FIGS. 4a-4f, except with previously doped regions 450 covered by LPD barrier layer instead, to yield a separate set of doping regions 460 (FIG. 4G). For example doping regions 460 may be n-type and regions 450 may be p-type, which would be useful in an all back contact (also known as a back contact/back junction) solar cell.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Example 1

This example demonstrates the capability of a patterned film of LPD silicon dioxide to act as a diffusion barrier for a $POCl_3$ dopant diffusion.

125 mm×125 mm p-type silicon wafers with pyramidal surface texture were cleaned by dipping in 1:10 HF:Water for 10 minutes followed by extensive rinsing in deionized water.

A polymer resist ink is formulated by dissolving a polymer composed of approximately 88% vinylbutyral, 11% vinylalcohol, and 1% vinylacetate monomer units in butoxyethanol at 17 weight % polymer. A test pattern of polymer resist ink is screen printed on the wafers followed by baking at 70° C., producing areas on the wafers with and without coverage of the polymer.

An LPD stock solution is created by adding 70 g of high purity fumed silica per 1 liter of 35 wt % $H_2SiF_6$ aqueous solution. The mixture is stirred for 12 hours at room temperature, at which point excess silica is filtered out, yielding a saturated solution. For a given deposition, 1100 g of the above solution and 3300 g of water are mixed and heated to the process temperature, at which point the patterned substrates are immersed. The length of time spent in the solution and the solution temperature determine the thickness of the LPD silicon dioxide film. The LPD film forms only in areas of the substrate that are not covered with the polymer resist.

After the deposition, the substrates are removed, rinsed thoroughly with deionized water, and dried. The resulting substrates are then rinsed in acetone with sonication, which removes the polymer resist. The substrates now contain a pattern of LPD silicon dioxide in areas that did not have polymer resist, while the bare silicon surface is exposed in the other areas.

A $POCl_3$ based phosphorous doping is them performed. The substrates are loaded into a horizontal diffusion furnace idling at 700° C. The temperature is raised to 860° C. under a flow of 8 slpm of $N_2$. Once at 860° C., the flow is changed to 8 slpm of $N_2$ and 200 sccm of $O_2$ for 5 minutes. Then a 10 minute POCl3 treatment was performed by adding an additional flow of 800 sccm of $N_2$ containing 3.7 mol % $POCl_3$ vapor (for an overall molar concentration of $POCl_3$ of 0.33%). The $POCl_3$ flow is then turned off and the N2 and $O_2$ flows adjusted to 8 slm and 800 sccm for a 20 minute drive in step. The wafers are then removed and cooled.

Resistivity of the wafers is measured using a four point probe test. The resistivity on areas where the LPD is absent is labeled Rc, and the resistivity in areas where LPD is present is labeled Re. Table 1A shows the results of these measurements for two samples that had received different LPD treatments.

TABLE 1A

| Sample | LPD Treatment | Approx SiO2 thickness (nm) | Rc (ohm/sq) | Re (ohm/sq) |
|---|---|---|---|---|
| E1-1 | 45° C./15 minutes | 18 | 40.1 (n-type) | 72.1 (n-type) |
| E1-2 | 45° C./30 minutes | 35 | 46.4 (n-type) | 200.3 (p-type) |

Table 1A shows that in the absence of LPD film, the resistivity Rc is similar for the two samples. These resistivity values are low and n-type, indicating a high level of doping achieved by the above treatment. Where the LPD is present (measurements Re) the obtained resistivity is a strong function of the thickness of the LPD films. The thinner LPD film of example E1-1 does prevent some diffusion of phosphorous, as indicated by the elevated value of Re relative to Rc. For the case of E1-2, the LPD film is such a good barrier that the diffusion condition does not even succeed in driving the surface of the wafer to n-type from its original p-type doping. Thus, it is clear that LPD films can be patterned with our inventive methods and function as excellent and tunable diffusion barriers.

Example 2

This example demonstrates the capability of a patterned film of LPD silicon dioxide to act as a diffusion barrier for a spin on dopant diffusion.

Silicon wafers are processed as in example 1 to yield patterned LPD silicon dioxide films. Instead of a $POCl_3$ based dopant diffusion, the wafers are spin coated with Honeywell P-8545 spin-on phosphorous dopant. After a 250° C. bake for 15 minutes to ensure a dry coating, the coatings are annealed at 950° C. for 16 minutes in air in a rapid thermal processor.

Resistivity of the wafers was measured using a four point probe test. The resistivity on areas where the LPD was absent is labeled Rc, and the resistivity in areas where LPD is present is labeled Re. Table 2A shows the results of these measurements for three samples that had received different LPD treatments.

TABLE 2A

| Sample | LPD Treatment | Approx SiO2 thickness (nm) | Rc (ohm/sq) | Re (ohm/sq) |
|---|---|---|---|---|
| E2-1 | 45° C./8 minutes | 10 | 27.1 (n-type) | 48.7 (n-type) |
| E2-2 | 45° C./15 minutes | 18 | 37.1 (n-type) | 150.2 (p-type) |
| E2-3 | 45° C./30 minutes | 35 | 33.8 (n-type) | 150.9 (p-type) |

Table 2A shows that in the absence of LPD film, the resistivity Rc is similar for the three samples. These resistivity values are low and n-type, indicating a high level of doping achieved by the above treatment. Where the LPD is present (measurements Re) the obtained resistivity is a strong function of the thickness of the LPD films. The thinner LPD film of example E2-1 does prevent some diffusion of phosphorous, as indicated by the elevated value of Re relative to Rc. For the case of E2-2 and E2-3 the LPD film is such a good barrier that the diffusion condition does not even succeed in driving the surface of the wafer to n-type. Thus, it is clear that LPD films can be patterned with our inventive methods and function as excellent and tunable diffusion barriers.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A method of producing patterned doping on a semiconductor comprising:
    selecting a semiconductor substrate for a solar cell;
    depositing of a polymeric material on said semiconductor substrate, wherein said polymeric material prevents the deposition of a barrier material;
    depositing the barrier material on said semiconductor substrate utilizing liquid phase deposition (LPD), wherein the LPD deposits a barrier layer of said barrier material in at least one first region on said semiconductor substrate without said polymeric material, and said polymeric material prevents the barrier material from being deposited in at least one second region on said semiconductor substrate; and
    diffusing a dopant into the semiconductor substrate to form an emitter of the solar cell, wherein the diffusion of said dopant is impeded by said barrier material of said at least one first region, diffusing the dopant creates a surface of the semiconductor substrate with at least one first doped region below the at least one second region and at least one second region below the barrier layer that has lower doping than the at least one first surface region, wherein the diffusion of the dopant also comprises the steps of
    an initial temperature ramp to a diffusion temperature,
    exposing the semiconductor substrate to oxygen after the initial temperature ramp and prior to diffusing or exposure to the dopant,
    a drive-in exposing the semiconductor substrate to an oxygen and nitrogen mixture, and
    a cool down step.

2. The method of claim 1, wherein the polymeric material is a copolymer that contains greater than or equal to 80 molar % poly(vinylbutyral) and equal or between to 10 and 20% poly(vinlyalcohol).

3. The method of claim 1, wherein the barrier material is an oxide.

4. The method of claim 3, wherein the oxide is silicon dioxide, aluminum oxide, or titanium oxide.

5. The method of claim 1, wherein the barrier layer has a thickness of 50 nm or less.

6. The method of claim 1, further comprising removing the polymeric material after deposition of the barrier material and before the diffusion of the dopant.

7. The method of claim 1, further comprising removing the polymeric material by subjecting the semiconductor substrate to temperatures of 500° C. or greater prior to the diffusion of the dopant, during ramp up to the diffusion of the dopant, or during the diffusion of the dopant.

8. The method of claim 1, wherein the diffusion of the dopant is performed by elevating the temperature of the semiconductor substrate and exposing to dopant precursor gases.

9. The method of claim 1, wherein the diffusion of the dopant is performed by coating the semiconductor substrate with a dopant coating and elevating the temperature of the semiconductor substrate.

10. The method of claim 1, wherein the semiconductor substrate is exposed to a dopant vapor flow between the initial temperature ramp and the drive-in.

11. The method of claim 1, wherein the step of exposing the semiconductor substrate to oxygen is for 2 minutes or greater with a concentration of 1% (molar) oxygen or greater.

12. The method of claim 10, wherein a molar oxygen concentration during diffusing is equal to or between 0.5 to 3%.

13. The method of claim 10, wherein a ratio of a dopant flow time for said dopant to a drive in time of the drive-in is less than or equal to 1.

14. The method of claim 1, wherein the at least one second region below the barrier layer is un-doped after the diffusing of the dopant.

15. A method of producing patterned doping on a semiconductor comprising:
    selecting a semiconductor substrate;
    depositing of a first polymeric material on said semiconductor substrate, wherein said first polymeric material prevents the deposition of a first barrier material;
    depositing the first barrier material on said semiconductor substrate utilizing liquid phase deposition (LPD), wherein the LPD deposits a first barrier layer of the first barrier material in at least one first region on said semiconductor substrate without said first polymeric material, and the first polymeric material prevents the first barrier material from being deposited in at least one second region on said semiconductor substrate; and diffusing a first dopant into the semiconductor substrate, wherein the diffusion of said first dopant is eliminated by said first barrier material of said at least one first region, and diffusing the first dopant creates a surface of the semiconductor substrate with at least one first doped region below the at least one second region and the surface below the first barrier layer that is un-doped.

16. The method of claim 15, further comprising:
removing said first barrier material from said semiconductor substrate after diffusion of the first dopant;
printing a second polymeric material on top of the at least one second surface region;
depositing a second barrier material on said semiconductor substrate, wherein said second barrier material forms a second barrier layer deposited on top of said at least one first doped region, and the second polymeric material prevents the second barrier material from being deposited on the surface that remained un-doped from the diffusion of the first dopant; and
diffusing a second dopant into the semiconductor substrate, wherein the diffusion of said second dopant is eliminated by said second barrier material on the at least one first doped region, diffusion of the second dopant creates at least one second doped region where the second barrier material was not deposited, and the at least one first doped region is not effected by said diffusing of the second dopant.

17. The method of claim 15, further comprising removing the first polymeric material by subjecting the semiconductor substrate to temperatures of 500° C. or greater prior to the diffusion of the first dopant, during ramp up to the diffusion of the first dopant, or during the diffusion of the first dopant.

18. The method of claim 15, further comprising exposing the semiconductor substrate to oxygen before the diffusion of dopant.

19. The method of claim 18, wherein the diffusion of the first dopant comprises the steps of an initial temperature ramp to a diffusion temperature; exposure to a dopant vapor flow; a drive-in exposing the semiconductor substrate to an oxygen and nitrogen mixture; and a cool down step.

* * * * *